United States Patent
Li et al.

(10) Patent No.: US 11,451,197 B2
(45) Date of Patent: Sep. 20, 2022

(54) OUTPUT STAGE CIRCUIT

(71) Applicant: Shanghai Zhaoxin Semiconductor Co., Ltd., Shanghai (CN)

(72) Inventors: Shen Li, Shanghai (CN); Zhongding Liu, Shanghai (CN)

(73) Assignee: Shanghai Zhaoxin Semiconductor Co., Ltd., Shanghai (CN)

(*) Notice: Subject to any disclaimer, the term of this patent is extended or adjusted under 35 U.S.C. 154(b) by 152 days.

(21) Appl. No.: 16/987,337

(22) Filed: Aug. 6, 2020

(65) Prior Publication Data

US 2021/0320630 A1 Oct. 14, 2021

(30) Foreign Application Priority Data

Apr. 10, 2020 (CN) .......................... 202010278121.8

(51) Int. Cl.
*H03F 3/16* (2006.01)
*H03K 5/24* (2006.01)

(52) U.S. Cl.
CPC .................. *H03F 3/16* (2013.01); *H03K 5/24* (2013.01)

(58) Field of Classification Search
CPC .......... H03F 3/16; H03F 1/0272; H03F 1/523; H03F 3/2173; H03F 3/68; H03K 5/24

USPC ................................ 330/296, 285, 311, 298
See application file for complete search history.

(56) References Cited

U.S. PATENT DOCUMENTS

| | | | | |
|---|---|---|---|---|
| 7,936,209 B2 * | 5/2011 | Bhattacharya | ............................... H03K 19/018528 327/108 |
| 8,994,412 B2 * | 3/2015 | Kim | ................. H03K 3/356165 327/109 |
| 9,614,529 B1 * | 4/2017 | Chen | .............. H03K 19/018514 |

* cited by examiner

*Primary Examiner* — Hieu P Nguyen
(74) *Attorney, Agent, or Firm* — JCIPRNET

(57) ABSTRACT

An output stage circuit comprising a bias voltage generator, a first amplifier circuit and a second amplifier circuit is provided. The bias voltage generator is coupled to an output terminal of the output stage circuit to generate a bias voltage according to an output voltage of the output terminal. The first amplifier circuit is coupled to the output terminal, a first power supply terminal and the bias voltage generator, receives a first pre-driving signal, a first predetermined voltage and the bias voltage, and determines whether to transmit a first voltage to serve as the output voltage. The second amplifier circuit is coupled to the output terminal, a second power supply terminal and the bias voltage generator, receives a second pre-driving signal, a second predetermined voltage and the bias voltage, and determines whether to transmit a second voltage to serve as the output voltage.

12 Claims, 5 Drawing Sheets

OUTPUT STAGE CIRCUIT

CROSS-REFERENCE TO RELATED APPLICATION

This application claims the priority benefit of China application no. 202010278121.8, filed on Apr. 10, 2020. The entirety of the above-mentioned patent application is hereby incorporated by reference herein and made a part of this specification.

BACKGROUND

Technical Field

The disclosure relates to an output stage circuit, and particularly relates to an output stage circuit capable of avoiding or reducing damage resulting from voltage overshoot.

Description of Related Art

When the structure of a chip is designed, characteristics of manufactured components may be different due to different semiconductor processes. For example, transistors produced by different semiconductor processes may have different voltage withstand levels. In addition, based on technical specifications and application limitations and advances in semiconductor technology, an input/output signal voltage used in a currently circuit is designed in accordance with rules of an adopted interface. For example, the input/output signal voltage is required to adopt a 3.3V voltage signal to be compatible with a communication protocol of a USB 2.0 interface. In general, if a currently common semiconductor process (for example, a semiconductor process of 28 nm, 16 nm, etc.) is adopted to design a relevant circuit structure for inputting and outputting signals, withstand voltages of available transistors cannot directly match the voltage specification of the input/output signal limited by some interface protocols. For example, some transistors that may only withstand 1.8 V and cannot directly accept the input/output signal with 3.3V voltage, so it is necessary to design an output stage circuit that may withstand the input/output signal with 3.3V voltage.

However, when the output stage circuit is actually used, since there must be a phenomenon of voltage overshoot of the input/output signal, the withstand voltages of some components of the output stage circuit may exceed designed predetermined values, which reduces a service life of the output stage circuit, or even directly burns out a part of components of the output stage circuit or other circuits. Therefore, how to use transistors with the lower withstand voltage to design a reliable output stage circuit to implement transmission of higher voltage signals is currently one of the directions for further research.

SUMMARY

The invention is directed to an output stage circuit, the output stage circuit dynamically adjusts a bias voltage according to a value of an output voltage, so that three-terminal voltages of each transistor of an amplifier circuit do not exceed a withstand voltage of the transistor, thereby avoiding or reducing the output stage circuit from being damaged by voltage overshoot and shortening a service life.

The invention provides an output stage circuit comprising a bias voltage generator, a first amplifier circuit and a second amplifier circuit. The bias voltage generator is coupled to an output terminal of the output stage circuit to generate a bias voltage according to an output voltage of the output terminal. The first amplifier circuit is coupled to the output terminal of the output stage circuit, a first power supply terminal and the bias voltage generator. The first amplifier circuit receives a first pre-driving signal, a first predetermined voltage and the bias voltage. According to the first pre-driving signal, the first predetermined voltage and the bias voltage, the first amplifier circuit determines whether to turn on the first amplifier circuit to transmit a first voltage from the first power supply terminal to the output terminal to serve as the output voltage. The second amplifier circuit is coupled to the output terminal, a second power supply terminal and the bias voltage generator. The second amplifier circuit receives a second pre-driving signal, a second predetermined voltage and the bias voltage. According to the second pre-driving signal, the second predetermined voltage and the bias voltage, the second amplifier circuit determines whether to turn on the second amplifier circuit to transmit a second voltage from the second power supply terminal to the output terminal to serve as the output voltage.

Based on the above description, the output stage circuit of the embodiment of the invention is implemented by an amplifier circuit structure of at least three tiers, and combined with a floating bias voltage to prevent three-terminal voltages of each transistor from exceeding a withstand voltage of the transistor. Namely, the bias voltage generator of the output stage circuit dynamically adjusts the bias voltage according to the value of the output voltage. When the value of the output voltage is higher, a value of the bias voltage is increased accordingly. Correspondingly, when the value of the output voltage is lower, the value of the bias voltage is decreased accordingly. In this way, the three-terminal voltages of a part of transistors of the amplifier circuit do not exceed the respective withstand voltages of the part of the transistors due to the dynamic adjustment of the bias voltage, thereby avoiding or reducing the output stage circuit from being damaged by voltage overshoot and shortening the service life.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
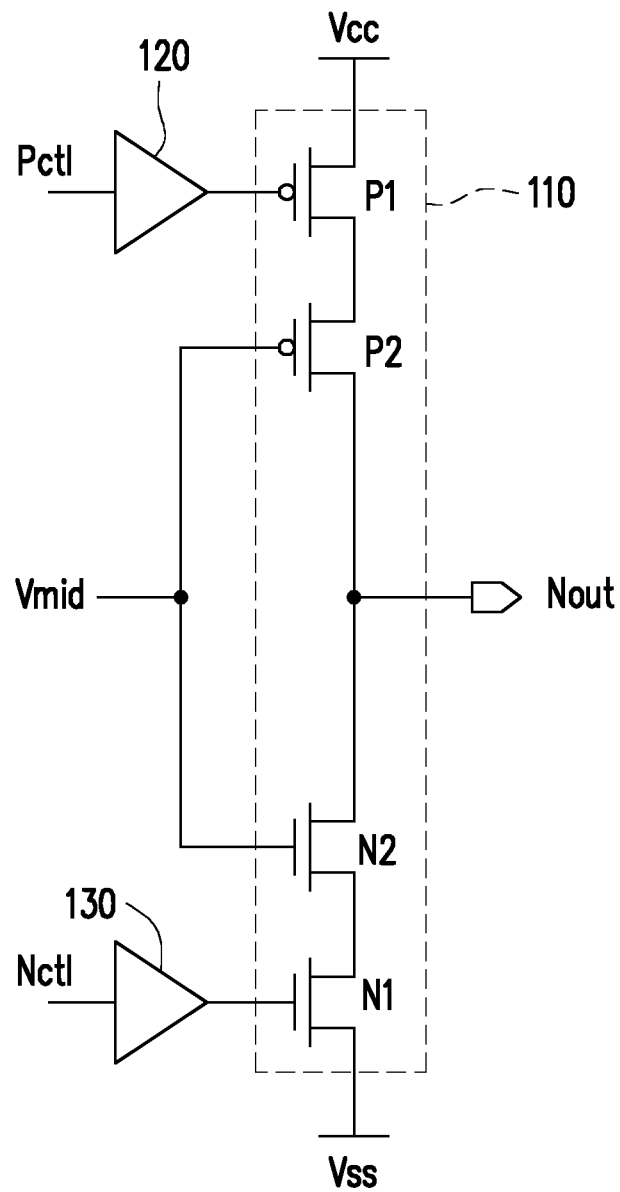
FIG. 1 is a circuit diagram of an output stage circuit 100.

FIG. 1 is a circuit diagram of an output stage circuit 100. The output stage circuit 100 in FIG. 1 comprises a two-tier amplifier circuit 110 composed of transistors P1, P2, N1 and N2, and two pre-drivers 120 and 130. It is assumed that a withstand voltage of each transistor of the output stage circuit 100 is 1.8V due to limitation of a semiconductor process, and a chip using the output stage circuit 100 needs to transmit a data signal with a maximum voltage of 3.3V at an output terminal Nout of the output stage circuit 100 due to a transmission protocol of a specific interface. The transistors P1 and P2 of the embodiment are both P-type metal-oxide-semiconductor field-effect transistors (MOSFETs), and the transistors N1 and N2 are both N-type MOSFETs.

The pre-driver 120 receives a first control signal Pctl and pre-drives the first control signal Pctl, and transmits the pre-driven first control signal Pctl to a control terminal (a gate) of the transistor P1. The pre-driver 130 receives a second control signal Nctl and pre-drives the second control signal Nctl, and transmits the pre-driven second control signal Nctl to a control terminal (a gate) of the transistor N1. In other words, the first control signal Pctl controls whether to turn on the transistor P1 through the pre-driver 120; and the second control signal Nctl controls whether to turn on the transistor N1 through the pre-driver 130. Control terminals (gates) of the transistors P2 and N2 receive a voltage Vmid. In the embodiment, a voltage value of the voltage Vmid is one half of a voltage value of a first voltage Vcc. In this way, in general, the transistors P2 and N2 may protect each of the transistors P1-P2, N1-N2 in the two-tier amplifier circuit 110 from being damaged by a voltage signal of 3.3V.

However, in practical applications, when a voltage at the output terminal Nout is interfered, for example, jittered due to an interference of a voltage overshoot effect, the circuit structure of the output stage circuit 100 may be easily damaged. For example, in the case where a host end and a device end are both configured with a power supply for data transmission, the output stage circuits of the host end and the device end need to withstand a larger withstand voltage, so that the output stage circuit 100 may be easily damaged; or in the case of adopting a related circuit (such as a transmission driver) of a universal serial bus (USB) 2.0 DP/DM interface, the output stage circuit 100 of FIG. 1 may be easily damaged due to the voltage overshoot effect. The reason for the damage of the output stage circuit 100 is that data transmission performed under a high speed mode of the USB 2.0 DP/DM interface requires that the voltage of the output terminal Nout of the output stage circuit 100 may be as low as −400 mV, and data transmission performed under a full speed mode requires that the voltage of the output terminal Nout of the output stage circuit 100 varies within a range from −500 mV to 3.6 V due to the possible voltage overshoot effect. If these conditions are satisfied, three-terminal voltages of the transistors P2 and N2 of the two-tier amplifier circuit 110 may severely exceed the respective withstand voltages (such as 1.8 V) of the transistors P2 and N2, which results in failure or even burnout of the transistors P2 and N2, and affects a service life of the output stage circuit 100.

Therefore, in the embodiment of the invention, an amplifier circuit structure of at least three tiers is adopted to combine with a floating bias voltage, so that the three-terminal voltages of each transistor of the output stage circuit does not exceed the withstand voltage of the transistor, and each transistor may withstand the voltage of voltage overshoot or undershoot of the output voltage, so as to avoid or reduce the output stage circuit from being damaged by the voltage overshoot, and shortening its service life. An embodiment is provided below for further description.

Figure 2:
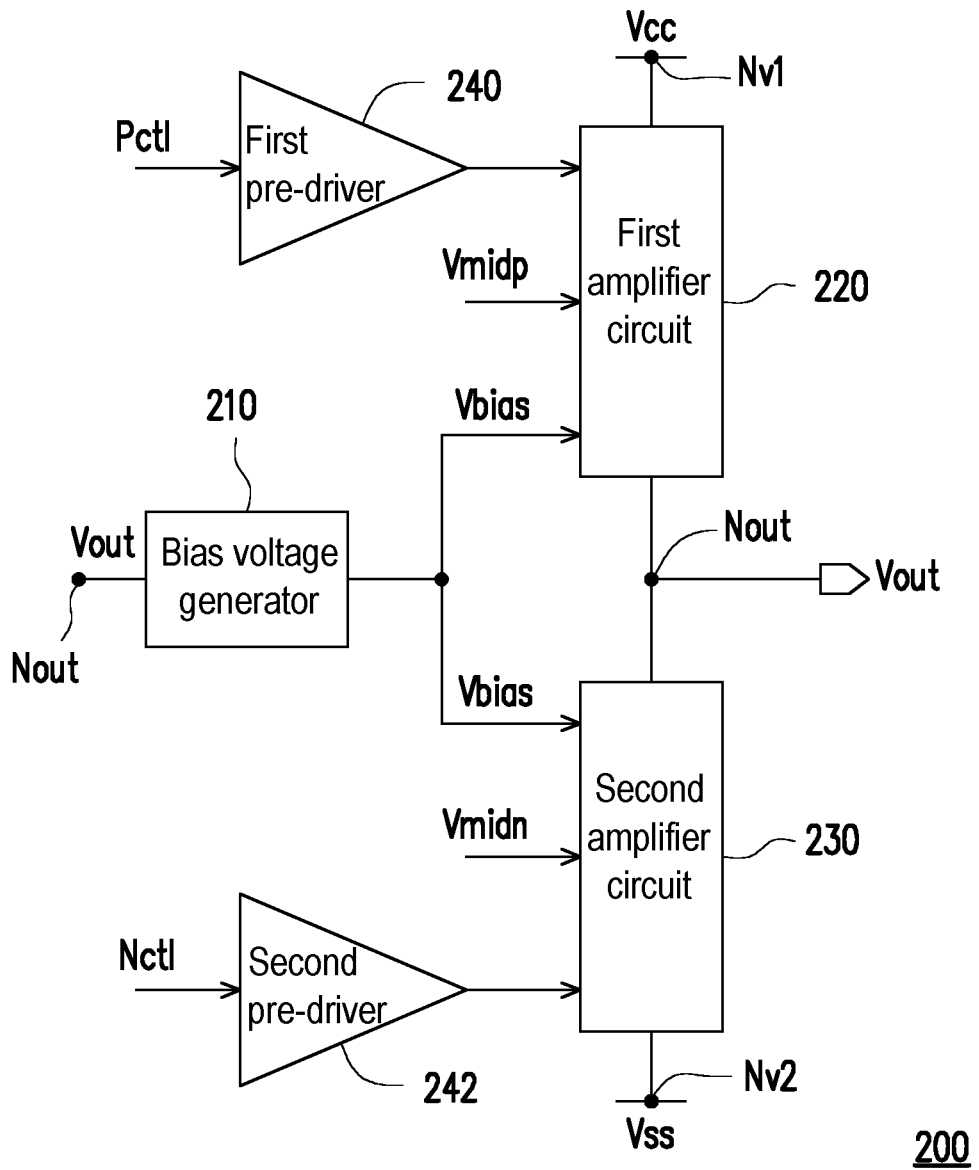
FIG. 2 is a schematic diagram of an output stage circuit 200 according to an embodiment of the invention.

FIG. 2 is a schematic diagram of an output stage circuit 200 according to an embodiment of the invention. The output stage circuit 200 of the embodiment may be applied to an input/output circuit of a transmission end (TX) using the USB 2.0 interface and having a full/low speed mode, and the output stage circuit 200 may be fabricated by using a 16 nm semiconductor process. Those skilled in the art may adjust an application interface and a transmission protocol applied to the output stage circuit 200 according to their needs, and may adopt other semiconductor processes, for example, semiconductor processes such as 12 nm, 10 nm, 8 nm, 7 nm, 5 nm, 3 nm, etc., to fabricate the output stage circuit 200.

Figure 3:
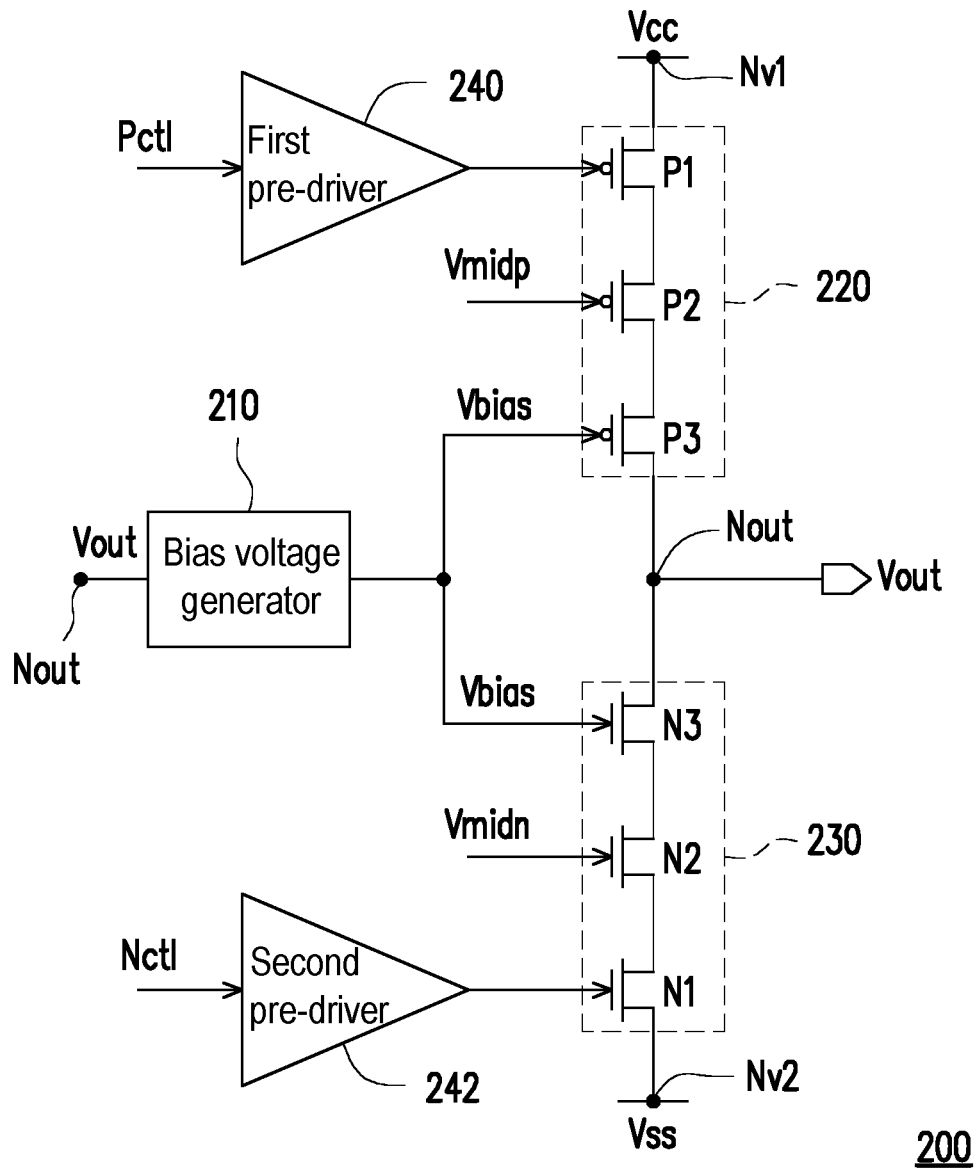
FIG. 3 is a detailed circuit diagram of the output stage circuit 200 according to an embodiment of the invention.
Figure 4:
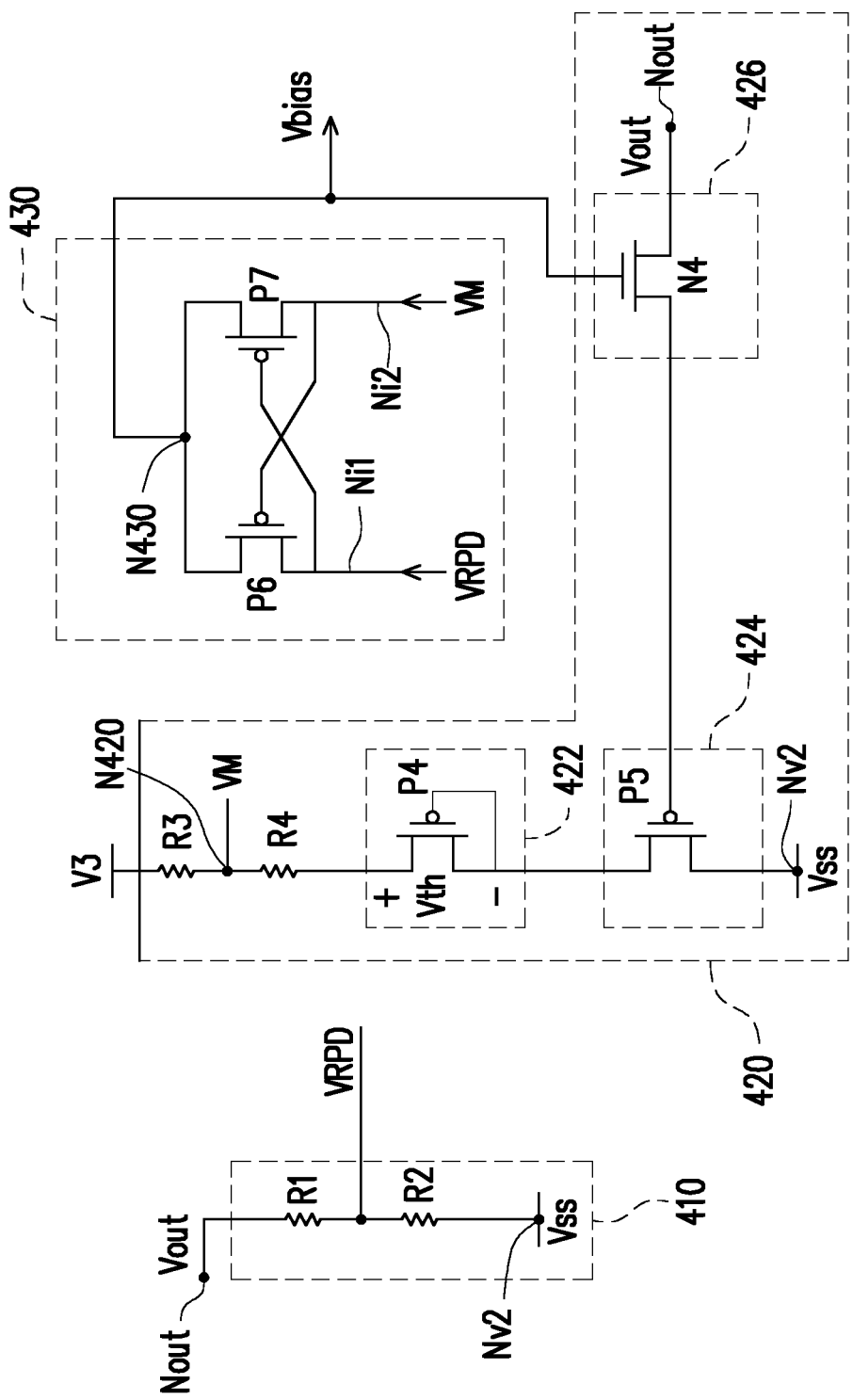
FIG. 4 is a circuit diagram of a bias voltage generator 210 in FIG. 2.

The output stage circuit 200 mainly comprises a bias voltage generator 210, a first amplifier circuit 220 and a second amplifier circuit 230. The output stage circuit 200 may further comprise a first pre-driver 240 and a second pre-driver 242. The bias voltage generator 210 is coupled to the output terminal Nout of the output stage circuit 200 to generate a bias voltage Vbias according to an output voltage Vout of the output terminal Nout. The first amplifier circuit 220 is coupled to the output terminal Nout of the output stage circuit 200, a first power supply terminal Nv1, the bias voltage generator 210 and the first pre-driver 240. According to the pre-driven first control signal Pctl, a first predetermined voltage Vmidp and the bias voltage Vbias, the first amplifier circuit 220 determines whether to turn on itself to transmit the first voltage Vcc of the first power supply terminal Nv1 to the output terminal Nout to serve as the output voltage Vout. The first voltage Vcc of the embodiment may be a power supply voltage, for example, a power supply voltage of 3.3V. The second amplifier circuit 230 is coupled to the output terminal Nout of the output stage circuit 200, a second power supply terminal Nv2, the bias voltage generator 210 and the second pre-driver 242. According to the pre-driven second control signal Nctl, a second predetermined voltage Vmidn and the bias voltage Vbias, the second amplifier circuit 230 determines whether to turn on itself to transmit a second voltage Vss of the second power supply terminal Nv2 to the output terminal Nout to serve as the output voltage Vout. The second voltage Vss of the embodiment may be a ground voltage. The first amplifier circuit 220 and the second amplifier circuit 230 respectively comprise at least three transistors connected in series, herein the number of transistors connected in series and comprised by the first amplifier circuit 220 or the second amplifier circuit 230 may be the same or different. Referring to FIG. 3 and FIG. 4 for a detailed circuit structure configuration of each component of the output stage circuit 200.

In an embodiment of the invention, the series connection refers to among the P-type MOSFETs, for a first P-type MOSFET, a first terminal (a source) of the first P-type MOSFET is coupled to the first voltage Vcc, for a second P-type MOSFET to a penultimate P-type MOSFET, a first terminal (a source) of each P-type MOSFET is coupled to a second terminal (a drain) of a previous P-type MOSFET, and for the last P-type MOSFET, for the last P-type MOSFET, a second terminal (a drain) of the last P-type MOSFET is coupled to the output terminal Nout. The series connection also refers to among the N-type MOSFETs, for a first N-type MOSFET, a first terminal (a source) of the first N-type MOSFET is coupled to the second voltage Vss, for a second N-type MOSFET to a penultimate N-type MOSFET, a first terminal (a source) of each N-type MOSFET is coupled to a second terminal (a drain) of a previous N-type MOSFET, and for the last N-type MOSFET, a second terminal (a drain) of the last N-type MOSFET is coupled to the output terminal Nout.

FIG. 3 is a detailed circuit diagram of the output stage circuit 200 according to an embodiment of the invention. FIG. 3 mainly discloses a connection method of each of the transistors and a voltage value configuration of the first amplifier circuit 220 and the second amplifier circuit 230. The first amplifier circuit 220 comprises a first switch transistor, such as a transistor P1, at least one first stacked transistor, such as a transistor P2, and a first bias transistor, such as a transistor P3. The second amplifier circuit 230 comprises a second switch transistor, such as a transistor N1, at least one second stacked transistor, such as a transistor N2, and a second bias transistor, such as a transistor N3. In the embodiment, the transistors P1 to P3 are all P-type MOSFETs, and the transistors N1 to N3 are all N-type MOSFETs. In some embodiments, a resistor used for adjusting a bias voltage may be additionally added between the transistor P3 and the output terminal Nout, and/or between the transistor N3 and the output terminal Nout, so as to adjust an output impedance of the output stage circuit 200.

A first terminal (a source) of the transistor P1 is coupled to the first power supply terminal Nv1 to receive the first voltage Vcc. A control terminal (a gate) of the transistor P1 receives the pre-driven first control signal Pctl. The pre-driving operation is executed by the first pre-driver 240, the first pre-driver 240 receives the first control signal Pctl and pre-drives the first control signal Pctl. Herein the pre-driving refers to that an upper threshold and a lower threshold of a voltage range of the first control signal Pctl are respectively raised. For example, for raising a lower threshold of the first control signal Pctl with a voltage range of [0 V,0.8 V], the first control signal Pctl of 0 V is pre-driven to 1.65 V; for raising an upper threshold of the first control signal Pctl with the voltage range of [0 V,0.8 V], the first control signal Pctl of 0.8 V is pre-driven to 3.3 V. After the pre-driving operation, the voltage range of [0 V,0.8 V] of the first control signal Pctl is raised to a voltage range of [1.65 V, 3.3 V]. According to an embodiment of the invention, the first pre-driver 240 may be a level shifter. The first pre-driver 240 receives the first control signal Pctl and pre-drives the first control signal Pctl, and transmits the pre-driven first control signal Pctl to the control terminal (the gate) of the transistor P1 to control whether to turn on the transistor P1.

A control terminal (a gate) of the transistor P2 receives the first predetermined voltage Vmidp, and a first terminal (a source) of the transistor P2 is coupled to a second terminal (a drain) of the transistor P1. A first terminal (a source) of the transistor P3 is coupled to a second terminal (a drain) of the transistor P2, a control terminal (a gate) of the transistor P3 receives the bias voltage Vbias, and a second terminal (a drain) of the transistor P3 is coupled to the output terminal Nout.

A first terminal (a source) of the transistor N1 is coupled to the second power supply terminal Nv2 to receive the second voltage Vss. A control terminal (a gate) of the transistor N1 receives the pre-driven second control signal Nctl. The pre-driving operation is executed by the second pre-driver 242. The second pre-driver 242 receives the second control signal Nctl and pre-drives the second control signal Nctl. The pre-driving refers that an upper threshold of a voltage range of the second control signal Nctl is raised, but a lower threshold of the voltage range of the second control signal Nctl is not changed. For example, the second control signal Nctl of 0 V is pre-driven, and the pre-driven second control signal Nctl is still 0 V. To raise an upper threshold of the second control signal Nctl with the voltage range of [0 V,0.8 V], the second control signal Nctl of 0.8 V is pre-driven, and the pre-driven second control signal Nctl is 1.65 V. As a result, the voltage range of [0 V,0.8 V] of the second control signal Nctl is raised to a voltage range of [0 V, 1.65 V] after the pre-driving operation. According to an embodiment of the invention, the second pre-driver 242 may also be a level shifter. In other words, the second pre-driver 242 receives the second control signal Nctl and pre-drives the second control signal Nctl, and transmits the pre-driven second control signal Nctl to the control terminal (the gate) of the transistor N1 to control whether to turn on the transistor N1.

A control terminal (a gate) of the transistor N2 receives the second predetermined voltage Vmidn, and a first terminal (a source) of the transistor N2 is coupled to a second terminal (a drain) of the transistor N1. A first terminal (a source) of the transistor N3 is coupled to a second terminal (a drain) of the transistor N2, a control terminal (a gate) of the transistor N3 receives the bias voltage Vbias, and a second terminal (a drain) of the transistor N3 is coupled to the output terminal Nout.

In particular, in the embodiment, one transistor P2 is used as the at least one first stacked transistor, so that the first amplifier circuit 220 comprises at least three transistors connected in series. Those skilled in the art may increase a number of the first stacked transistors according to actual needs, as long as the control terminal (the gate) of each first stacked transistor receives the first predetermined voltage Vmidp, and the first stacked transistors are stacked with each other, so as to increase a voltage tolerance of the first amplifier circuit 220. Correspondingly, in the embodiment, one transistor N2 is used as the at least one second stacked transistor, and those skilled in the art may increase a number of the second stacked transistors according to actual needs, as long as the control terminal (the gate) of each second stacked transistor receives the second predetermined voltage Vmidn, and the second stacked transistors are stacked with each other, so as to increase a voltage tolerance of the second amplifier circuit 230.

According to an embodiment of the invention, the cascaded connection of the at least one first stacked transistors refers to that among the P-type MOSFETs, for a first P-type MOSFET, the first terminal (the source) of the first P-type MOSFET is coupled to the second terminal (the drain) of the transistor P1, for the second P-type MOSFET to the penultimate P-type MOSFET, the first terminal (the source) of each P-type MOSFET is coupled to the second terminal (the drain) of the previous P-type MOSFET, and for a first P-type MOSFET, the second terminal (the drain) of the last P-type MOSFET is coupled to the first terminal (the source) of the transistor P3. The control terminals (the gates) of these P-type MOSFETs all receive the first predetermined voltage Vmidp. The cascaded connection of the at least one second stacked transistors refers to that among the N-type MOSFETs, for a first N-type MOSFET, the first terminal (the source) of the first N-type MOSFET is coupled to the second terminal (the drain) of the transistor N1, for the second N-type MOSFET to the penultimate N-type MOSFET, the first terminal (the source) of each N-type MOSFET is coupled to the second terminal (the drain) of the previous N-type MOSFET, and for the last N-type MOSFET, the second terminal (the drain) of the last N-type MOSFET is coupled to the output terminal Nout. The control terminals (the gates) of these N-type MOSFETs all receive the second predetermined voltage Vmidn.

The control terminals (the gates) of the transistors P3 and N3 receive the bias voltage Vbias, herein the voltage of the bias voltage Vbias changes as the voltage of the output voltage Vout changes. For example, when the output voltage Vout is 3.9 V, the bias voltage generator 210 controls the bias voltage Vbias to be 2.2 V, and when the output voltage Vout is −600 mV, the bias voltage generator 210 controls the bias voltage Vbias to be 1.0 V. In this way, the series connection structure of the transistors of the output stage circuit 200 may be effectively prevented from being damaged by the first voltage Vcc of 3.3 V or the output voltage Vout with a level range between −600 mV and 3.9V.

According to an exemplary embodiment of the invention, the first predetermined voltage Vmidp of the embodiment is a sum of a half value of the first voltage Vcc and a value of a floating voltage, for example, 0.1V, so that the first predetermined voltage Vmidp is 3.3 V/2+0.1 V=1.75 V. The second predetermined voltage Vmidn of the embodiment is a difference between a half value of the first voltage Vcc and the value of the floating voltage, so that the second predetermined voltage Vmidn is 3.3 V/2-0.1 V=1.55 V. A purpose of adding and subtracting the floating voltage to adjust the voltage values of the first predetermined voltage Vmidp and the second predetermined voltage Vmidn is to better protect the first stacked transistor (for example, the transistor P2) and the second stacked transistor (for example, the transistor N2) from damage. According to a secondary embodiment of the invention, both of the first predetermined voltage Vmidp and the second predetermined voltage Vmidn may be set to one half of the first voltage Vcc, so that the first predetermined voltage Vmidp and the second predetermined voltage Vmidn are both 3.3 V/2, i.e. 1.65V.

FIG. 4 is a circuit diagram of the bias voltage generator 210 in FIG. 2. Referring to FIG. 4, the bias voltage generator 210 of the embodiment comprises a first comparison voltage generating circuit 410, a second comparison voltage generating circuit 420, and a comparator 430. The first comparison voltage generating circuit 410 divides the output voltage Vout into a first comparison voltage VRPD according to a predetermined ratio. In detail, the first comparison voltage generating circuit 410 comprises a first resistor R1 and a second resistor R2. The first resistor R1 and the second resistor R2 form a voltage dividing circuit. A first terminal of the first resistor R1 is coupled to the output voltage Vout, a first terminal of the second resistor R2 is coupled to a second terminal of the first resistor R1 to serve as an output terminal of the first comparison voltage generating circuit 410, and a second terminal of the second resistor R2 is coupled to the second power supply terminal Nv2. So that a relationship between the first comparison voltage VRPD at the output terminal of the first comparison voltage generating circuit 410 and the output voltage Vout is: VRPD=Vout× R2/(R1+R2).×Vout.

Particularly, when the output stage circuit 200 is applied to a circuit compatible with the USB 2.0 interface standard, the first resistor R1 and the second resistor R2 may respectively directly make use of the 15 kΩ pull-down resistors necessary for the USB 2.0 interface. Therefore, in the embodiment of the invention, the circuit of the USB 2.0 interface is directly used to implement the first comparison voltage generating circuit 410 without additionally configuring two resistors. Herein, the ratio of the resistance values of the first resistor R1 and the second resistor R2 is a predetermined ratio, making the Vout:VRPD=1:0.56.

The second comparison voltage generating circuit 420 generates a second comparison voltage VM according to the output voltage Vout. In detail, the second comparison voltage generating circuit 420 comprises a third resistor R3, a fourth resistor R4, a diode 422, a source follower 424, and a protective transistor 426. A first terminal of the third resistor R3 receives a third voltage V3. The third voltage V3 of the embodiment is one half of the first voltage Vcc. A first terminal of the fourth resistor R4 is coupled to a second terminal of the third resistor R3 to serve as an output terminal N420 of the second comparison voltage generating circuit 420. The output terminal N420 of the second comparison voltage generating circuit 420 generates the second comparison voltage VM.

The diode 422 is implemented by a P-type transistor P4. A first terminal (a source) of the transistor P4 serves as an anode of the diode 422, and a second terminal (a drain) of the transistor P4 is coupled to a control terminal (a gate) of the transistor P4 to serve as a cathode of the diode 422. The anode of the diode 422 is coupled to a second terminal of the fourth resistor R4, and the cathode of the diode 422 is coupled to the source follower 424.

The source follower 424 is implemented by a P-type transistor P5. A first terminal (a source) of the transistor P5 is coupled to the cathode of the diode 422, and a second terminal (a drain) of the transistor P5 is coupled to the second power supply terminal Nv2. The protective transistor 426 of the embodiment is implemented by an N-type transistor N4. A first terminal (a drain) of the transistor N4 is coupled to a control terminal of the source follower 424 (a gate of the transistor P5), a second terminal (a source) of the transistor N4 is coupled to the output terminal Nout of the output stage circuit 200 to receive the output voltage Vout, and a control terminal (a gate) of the transistor N4 is coupled to an output terminal N430 of the comparator 430.

A first terminal Ni1 of the comparator 430 receives the first comparison voltage VRPD. A second terminal Ni2 of the comparator 430 receives the second comparison voltage VM. The comparator 430 provides a larger one of the first comparison voltage VRPD and the second comparison voltage VM to the output terminal N430 of the comparator 430 to serve as the bias voltage Vbias. The comparator 430 may be implemented by two P-type transistors P6 and P7. A first terminal (a source) of the transistor P6 is coupled to a first terminal (a source) of the transistor P7 to serve as the output terminal N430 of the comparator 430. A second terminal (a drain) of the transistor P6 is coupled to a control terminal (a gate) of the transistor P7 to serve as the first terminal Ni1 of the comparator 430. A second terminal (a drain) of the transistor P7 is coupled to a control terminal (a gate) of the transistor P6 to serve as the second terminal Ni2 of the comparator 430.

Hereafter, take the predetermined ratio as an example of the ratio of the first resistance R1 and the second resistance R2, with reference of FIG. 4, to describe the operating principle of the bias voltage generator 210. Those skilled may adjust the ratio of the first resistance R1 and the second resistance R2 to be other value according to their needs.

In the second comparison voltage generating circuit 420 shown in FIG. 4, resistance values of the third resistor R3 and the fourth resistor R4 are the same, and the diode 422 generates a voltage drop Vth at its own two ends. When a voltage overshoot occurs and the voltage value of the output voltage Vout is 3.9V, a voltage value of the first comparison voltage VRPD generated by the first comparison voltage generating circuit 410 is about 2.2V, i.e., 3.9 V×0.56, the aforementioned predetermined ratio of the first resistor R1 and the second resistor R2 determines that the ratio between the first comparison voltage VRPD and the output voltage Vout is 0.56.

On the other hand, the transistors P4 and P5 of the second comparison voltage generating circuit 420 are turned off so that no current may flow from a terminal where the third voltage V3 is formed to the second power supply terminal Nv2. In this way, the voltage value of the second comparison voltage VM is the same as the voltage value of the third voltage V3, which are both 1.65V. Therefore, the output terminal of the comparator 430 may generate the bias voltage Vbias equal to a voltage value of the first comparison voltage VRPD (2.2 V). In this way, three-terminal voltages of each transistor of the first amplifier circuit 220 and the second amplifier circuit 230 of FIG. 3 will not exceed 1.8 V.

Correspondingly, when a voltage undershoot occurs and the voltage value of the output voltage Vout is −600 mV, the voltage value of the first comparison voltage VRPD generated by the first comparison voltage generating circuit 410 is about −300 mV (−600 mV×0.56).

On the other hand, the transistors P4 and P5 of the second comparison voltage generating circuit 420 are turned on and no current may flow from the terminal where the third voltage V3 is formed to the second power supply terminal Nv2. In this way, the voltage value of the second comparison voltage VM is a sum of the third voltage V3 and the voltage drop Vth of the diode 422 (it is assumed that the voltage drop Vth is 0.35 V) divided by 2, which is about 1V, and an equation thereof is, (1.65 V+0.35 V)/2=1.0 V. Therefore, the output terminal of the comparator 430 may generate the bias voltage Vbias equal to the voltage value of the second comparison voltage VM (1.0V). In this way, three-terminal voltages of each transistor of the first amplifier circuit 220 and the second amplifier circuit 230 of FIG. 3 will not exceed 1.8 V.

Figure 5:
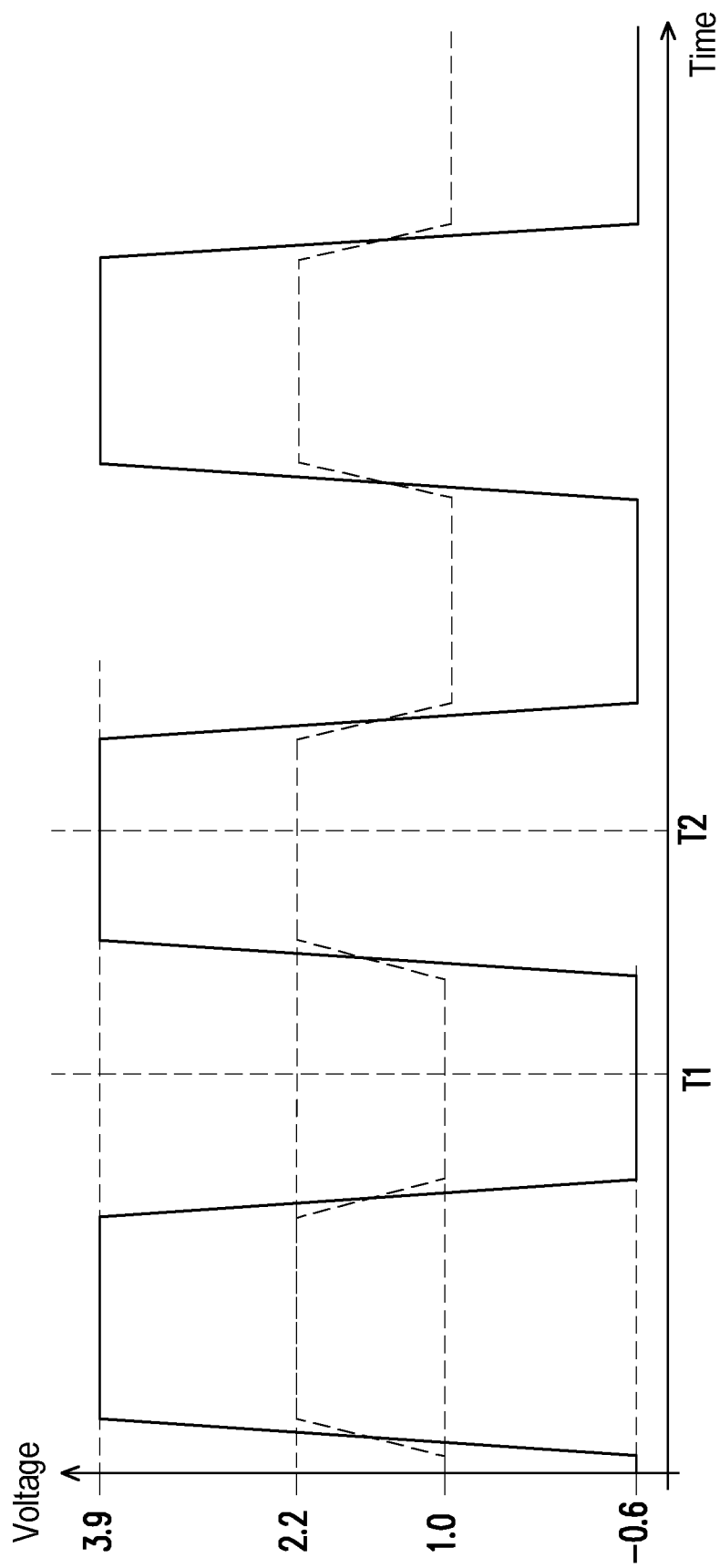
FIG. 5 is a waveform diagram of an output voltage and a bias voltage according to an embodiment of the invention.

FIG. 5 is a waveform diagram of the output voltage Vout and the bias voltage Vbias according to an embodiment of the invention. The waveform diagram of FIG. 5 is used for presenting operating characteristics of the bias voltage generator 210 in FIG. 2 to FIG. 4. A horizontal axis of FIG. 5 represents time points, and a vertical axis of FIG. 5 represents voltage values. At a time point T1, when the output voltage Vout is −0.6 V (i.e., −600 mV), the bias voltage Vbias is about 1.0 V. At a time point T2, when the output voltage Vout is 3.9 V, the bias voltage Vbias is about 2.2 V.

In summary, the output stage circuit of the embodiment of the invention is implemented by an amplifier circuit structure of at least three tiers, and combined with a floating bias voltage to prevent the three-terminal voltages of each transistor from exceeding the withstand voltage of the transistor. Namely, the bias voltage generator of the output stage circuit dynamically adjusts the bias voltage according to the value of the output voltage. When the value of the output voltage is high, the value of the bias voltage is increased accordingly in a floating manner. Correspondingly, when the value of the output voltage is low, the value of the bias voltage is decreased accordingly in the floating manner. In this way, the three-terminal voltages of a part of the transistors in the amplifier circuit will not exceed the respective withstand voltages of the part of the transistors due to the floating bias voltage, thereby avoiding or reducing the output stage circuit from being damaged by voltage overshoot and shortening the service life thereof.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An output stage circuit comprising:
   a bias voltage generator, coupled to an output terminal of the output stage circuit to generate a bias voltage according to an output voltage of the output terminal;
   a first amplifier circuit, coupled to the output terminal of the output stage circuit, a first power supply terminal and the bias voltage generator, the first amplifier circuit receives a first pre-driving signal, a first predetermined voltage and the bias voltage, according to the first pre-driving signal, the first predetermined voltage and the bias voltage, the first amplifier circuit determines whether to turn on the first amplifier circuit to transmit a first voltage from the first power supply terminal to the output terminal to serve as the output voltage; and
   a second amplifier circuit, coupled to the output terminal of the output stage circuit, a second power supply terminal and the bias voltage generator, the second amplifier circuit receives a second pre-driving signal, a second predetermined voltage and the bias voltage, according to the second pre-driving signal, the second predetermined voltage and the bias voltage, the second amplifier circuit determines whether to turn on the second amplifier circuit to transmit a second voltage from the second power supply terminal to the output terminal to serve as the output voltage, wherein the bias voltage generator comprises:
   a first comparison voltage generating circuit, dividing the output voltage into a first comparison voltage according to a predetermined ratio;
   a second comparison voltage generating circuit, generating a second comparison voltage according to the output voltage; and
   a comparator, comprising a first terminal receiving the first comparison voltage and comprising a second terminal receiving the second comparison voltage, wherein the comparator provides a larger one of the first comparison voltage and the second comparison voltage to an output terminal of the comparator to serve as the bias voltage.

2. The output stage circuit as claimed in claim 1, wherein the first comparison voltage generating circuit comprises:
   a first resistor, comprising a first terminal coupled to the output voltage and comprising a second terminal coupled to an output terminal of the first comparison voltage generating circuit; and
   a second resistor, comprising a first terminal coupled to the output terminal of the first comparison voltage generating circuit and comprising a second terminal coupled to the second power supply terminal,
   wherein the predetermined ratio is generated according to the resistance values of the first resistor and the second resistor.

3. The output stage circuit as claimed in claim 2, wherein the output stage circuit is applied to a circuit compatible with a universal serial bus 2.0 interface, and the first resistor and the second resistor are pull-down resistors of the universal serial bus 2.0 interface.

4. The output stage circuit as claimed in claim 1, wherein the second comparison voltage generating circuit comprises:
   a third resistor, comprising a first terminal receiving a third voltage, wherein the third voltage is one half of the first voltage;

a fourth resistor, comprising a first terminal coupled to a second terminal of the third resistor to serve as an output terminal of the second comparison voltage generating circuit, wherein the output terminal of the second comparison voltage generating circuit generates the second comparison voltage;

a diode, comprising an anode coupled to a second terminal of the fourth resistor;

a source follower, comprising a first terminal coupled to a cathode of the diode and comprising a second terminal coupled to the second power supply terminal; and a protective transistor, comprising a first terminal coupled to a control terminal of the source follower, comprising a second terminal coupled to the output terminal of the output stage circuit to receive the output voltage, and comprising a control terminal coupled to the output terminal of the comparator.

5. The output stage circuit as claimed in claim 1, wherein the first amplifier circuit comprises:

a first switch transistor, comprising a first terminal coupled to the first power supply terminal to receive the first voltage, and comprising a control terminal receiving a first control signal;

a first stacked transistor, comprising a control terminal receiving the first predetermined voltage, and comprising a first terminal coupled to a second terminal of the first switch transistor; and a first bias transistor, comprising a first terminal coupled to the first stacked transistor, comprising a control terminal receiving the bias voltage, and comprising a second terminal coupled to the output terminal.

6. The output stage circuit as claimed in claim 5, further comprising:

a first pre-driver, pre-driving the first control signal to generate the first pre-driving signal, and providing the first pre-driving signal to the control terminal of the first switch transistor.

7. The output stage circuit as claimed in claim 5, wherein a value of e first predetermined voltage is equal to a half value of the first voltage.

8. The output stage circuit as claimed in claim 5, wherein a value of the first predetermined voltage is equal to a sum of a half value of the first voltage and a value of a floating voltage.

9. The output stage circuit as claimed in claim 1, wherein the second amplifier circuit comprises:

a second switch transistor, comprising a first terminal coupled to the second power supply terminal to receive the second voltage, and comprising a control terminal receiving a second control signal;

a second stacked transistor, comprising a control terminal receiving the second predetermined voltage, and comprising a first terminal coupled to a second terminal of the second switch transistor; and a second bias transistor, comprising a first terminal coupled to the second stacked transistor, comprising a control terminal receiving the bias voltage, and comprising a second terminal coupled to the output terminal.

10. The output stage circuit as claimed in claim 9, further comprising:

a second pre-driver, pre-driving the second control signal to generate the second pre-driving signal, and providing the second pre-driving signal to the control terminal of the second switch transistor.

11. The output stage circuit as claimed in claim 9, wherein a value of the second predetermined voltage is equal to a half value of the first voltage.

12. The output stage circuit as claimed in claim 9, wherein a value of the second predetermined voltage is equal to a difference between a half value of the first voltage and a value of a floating voltage.

* * * * *